United States Patent
Lind et al.

[11] Patent Number: 6,069,601
[45] Date of Patent: May 30, 2000

[54] SOFT PROOFING DISPLAY

[75] Inventors: John T. Lind, Cranberry Township, Pa.; Donald N. Reeves, Chicago, Ill.; Richard D. Warner, Clinton, Pa.

[73] Assignees: R.R. Donnelley & Sons Company, Chicago, Ill.; Graphic Arts Technical Foundation, Pittsburg, Pa.

[21] Appl. No.: 08/983,551

[22] PCT Filed: Mar. 20, 1997

[86] PCT No.: PCT/US97/04501

§ 371 Date: Oct. 15, 1997

§ 102(e) Date: Oct. 15, 1997

[87] PCT Pub. No.: WO97/35424

PCT Pub. Date: Sep. 25, 1997

Related U.S. Application Data

[63] Continuation-in-part of application No. 08/621,289, Mar. 22, 1996.

[51] Int. Cl.⁷ .................................................. G02F 1/1335
[52] U.S. Cl. ........................... 345/88; 345/94; 349/106; 349/108; 358/500; 358/501; 358/510
[58] Field of Search ...................... 345/88, 94; 349/106, 349/108; 358/500, 501, 510

[56] References Cited

U.S. PATENT DOCUMENTS

| | | | |
|---|---|---|---|
| 3,597,731 | 8/1971 | Reitboeck et al. | 340/146.3 R |
| 3,652,907 | 3/1972 | Page et al. | 317/235 R |
| 3,657,613 | 4/1972 | Brody et al. | 317/235 R |
| 3,705,309 | 12/1972 | Brody | 250/217 S |
| 3,720,856 | 3/1973 | Brody | 313/309 |
| 3,845,471 | 10/1974 | Reitbeock et al.d | 340/149 R |
| 3,849,633 | 11/1974 | Reitboeck et al.d | 235/61.12 N |
| 4,006,383 | 2/1977 | Luo et al. | 315/169 |
| 4,025,920 | 5/1977 | Reitboeck et al. | 343/5 DP |
| 4,042,854 | 8/1977 | Luo et al. | 315/169 TV |
| 4,110,664 | 8/1978 | Asars et al. | 315/169 TV |
| 4,135,959 | 1/1979 | Luo et al. | 156/230 |
| 4,149,885 | 4/1979 | Luo et al. | 96/36.1 |
| 4,425,417 | 1/1984 | Ingalls et al. | 430/30 |
| 4,500,919 | 2/1985 | Schreiber | 358/78 |
| 4,522,491 | 6/1985 | Ingalls et al. | 355/77 |
| 4,827,118 | 5/1989 | Shabata et al. | 257/432 |
| 4,980,774 | 12/1990 | Brody | 358/241 |
| 4,980,775 | 12/1990 | Brody | 358/241 |
| 4,982,272 | 1/1991 | Brody | 358/59 |
| 4,982,273 | 1/1991 | Brody | 358/59 |
| 4,982,275 | 1/1991 | Brody | 358/59 |
| 5,067,021 | 11/1991 | Brody | 358/241 |
| 5,068,740 | 11/1991 | Brody | 358/241 |
| 5,079,636 | 1/1992 | Brody | 358/241 |
| 5,190,794 | 3/1993 | Yoshino et al. | 427/162 |

(List continued on next page.)

FOREIGN PATENT DOCUMENTS

| | | |
|---|---|---|
| 61-140923 | 6/1986 | Japan . |
| WO 83/03941 | 11/1983 | WIPO . |
| WO 94/08423 | 4/1994 | WIPO . |
| WO 95/12143 | 5/1995 | WIPO . |
| WO 97/35424 | 9/1997 | WIPO . |

OTHER PUBLICATIONS

"Reflective Color Displays for Imaging Applications," *Proceeds of the IS&T/SID 1995 Color Imaging Conference: Color Science, Systems and Applications*, date unknown, pp. 52–58.

International Search Report date Jul. 31, 1997, PCT Application No. PCT/US97/04501 filed Mar. 20, 1997.

"Trumach," *Electronic Publishing*, p. 34, Sep., 1997.

PCT Written Opinion dated Jan. 9, 1998, PCT Application No. PCT/US97/04501 filed Mar. 20, 1997.

Paper entitled "Color Filter Developed at the GATF" by T.P. Brody.

*Primary Examiner*—Bipin Shalwala
*Assistant Examiner*—Vincent E. Kovalick
*Attorney, Agent, or Firm*—Marshall, O'Toole, Gerstein, Murray & Borun

[57] ABSTRACT

A display for soft proofing an image to be reproduced using a set of selected printing colors includes a plurality of display elements each for displaying a color substantially spectrally matched to one of a set of printing colors.

13 Claims, 2 Drawing Sheets

U.S. PATENT DOCUMENTS

| | | | |
|---|---|---|---|
| 5,191,450 | 3/1993 | Yajima et al. | 359/54 |
| 5,211,463 | 5/1993 | Kalmanash | 362/26 |
| 5,296,947 | 3/1994 | Bowers | 358/527 |
| 5,352,634 | 10/1994 | Brody | 437/228 |
| 5,426,074 | 6/1995 | Brody | 437/228 |
| 5,426,517 | 6/1995 | Schwartz | 358/520 |
| 5,463,484 | 10/1995 | Brody | 349/106 |
| 5,481,655 | 1/1996 | Jacobs | 395/109 |
| 5,689,318 | 11/1997 | Matsuyama et al. | 349/106 |

SOFT PROOFING DISPLAY

CROSS REFERENCE TO RELATED APPLICATION

The present application comprises a continuation-in-part of application Ser. No. 08/621,289, filed Mar. 22, 1996.

TECHNICAL FIELD

The present invention relates generally to printing production processes prior to printing, and more particularly to an apparatus and method for creating soft proofing color filters.

BACKGROUND ART

Printing processes typically involve the creation of one or more proofs that allow the printer or printing customer to view a sample of the image to determine if words are spelled correctly, if images are located as desired and to determine if colors have been reproduced satisfactorily. There are multiple points in the printing process where an image or composite of images may be critiqued. Proofing is a time-and-material consuming step in the printing process, but is traditionally considered to be necessary so that alterations and/or corrections, often at the last minute, can be made.

At first, proofs were made on the press used to print the job. Specifically, plates were made from composed films and one or more proofs were printed using the plate, ink and paper of the job. Often, several copies were printed for the approval of the customer. This proofing method is still the method of choice when large numbers of samples (referred to as "press proofs") are required. Such proofs are as close as possible to the output to be produced by the job.

Because of the length of the traditional proofing cycle, products were developed that could lead to substantial reduction in proofing time. Such proofing processes create "offpress" proofs by sequentially exposing the four color films onto photosensitive colored composite layers that simulate the printed sheet. The colorants in the photosensitive foils are pigments that are similar to the printing ink pigments. The four colored foils are laminated, and exposed through films, in register on a white receiver sheet to produce the final offpress proof. Typically, these proofs were made immediately after the color scanning process, after color scan corrections were made and then again for the final composite proof. Of course, every adjustment required another proof to show the effect of the changes. Typical examples of offpress proofs are Cromalin by DuPont and Matchprint and Transfer Key by Imation.

If only one or two copies of a proof are required, the offpress proof is less expensive than a press proof. While the spectral match to ink and paper may not be totally perfect, it is close enough to be a useful guide to color approval. The time required to prepare offpress proofs that are of contract quality and acceptance is approximately 25 to 45 minutes per proof, as compared to the two to four hour time required for press proofing. Until recently, this turnaround time was generally considered acceptable.

In the 1980's, desktop publishing became a reality. Computers were finally powerful and inexpensive enough to allow for prepress color preparation off-site (e.g., at the publisher) from the color trade shop and printing plant. The results of color scans were displayed on cathode ray tube (CRT) color monitors. Color corrections and image manipulation were performed on the color monitor in the red-green-blue phosphor color space and transformed into cyan-magenta-yellow-black (CMYK) printing plate files. The CMYK files were converted to films and offpress proofs or press proofs were made from the films. From the beginning, there was a desire to use the color monitor as a soft proofing medium, but there were some limitations. The customer would need a remote color monitor for simultaneous viewing of the proof. Further, the viewing conditions would have to be controlled and/or standardized. Also, the color reproduced by the monitor was not considered to be representative of ink on paper, and therefore not useful as a consistent guide to color proofing owing to manufacturing processes, inherent differences between reflective and self-luminous displays and the spectral mismatch between monitor primary colors and ink colors.

The demand for a soft proofing device has continued to increase, accelerated by other technological developments, primarily the "computer-to-plate" and "computer-to-press" printing processes. This technology has the potential to eliminate film completely, thus eliminating the offpress proof and increasing the demand for a high fidelity soft proofing system. Also, image assembly and page imposition in these processes are accomplished by manipulating data files, resulting in a significant reduction in the amount of time required to undertake these tasks and thereby shifting the production bottleneck to the proofing process.

Schreiber, U.S. Pat. No. 4,500,919 discloses a system for reproducing colors including apparatus for causing a reproduction on a CRT to be a colorimetric match for a final printed page. Changes to the image can be interactively made by observing the image on the CRT as adjustments are made.

SUMMARY OF THE INVENTION

A display for soft proofing permits a user to inspect a proof of a printed page in a simple and inexpensive manner.

More particularly, according to one aspect of the present invention, a display for soft proofing an image to be reproduced using a set of selected colorants includes a plurality of display layers each comprising a light-sensitive coating of pigmented material which is exposed through a mask and developed and means for illuminating the plurality of display layers. The display appearance is substantially spectrally matched to the set of colorants.

According to a further aspect of the present invention, a method of forming a display panel for soft proofing an image to be reproduced using a set of selected printing colorants includes the steps of providing a substrate, forming a first display layer on the substrate, forming a second display layer on the first display layer and forming a third display layer on the second display layer. Each of the forming steps comprises the steps of depositing a layer of liquid pigmented materials, exposing the layer of pigmented materials through a mask and developing the exposed layer of pigmented materials. The display appearance is substantially spectrally matched to the set of printing colorants.

The apparatus and method of the present invention are capable of providing a better match to a printed reproduction than prior systems and methods.

Other features and advantages are inherent in the apparatus claimed and disclosed or will become apparent to those skilled in the art from the following detailed description in conjunction with the accompanying drawings.

DESCRIPTION OF THE PREFERRED EMBODIMENTS

Figure 1:
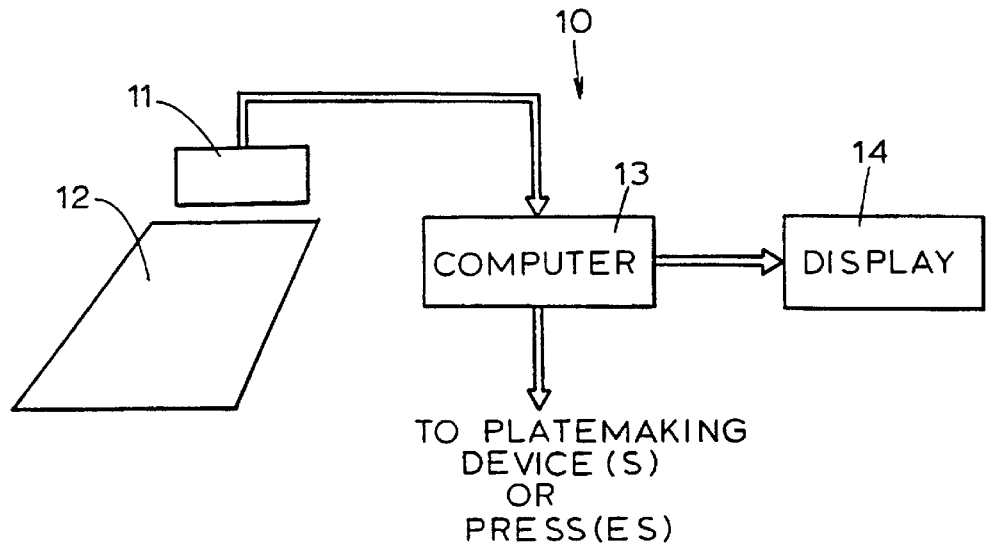
FIG. 1 is a block diagram of a computer-to-plate or computer-to-press system including a display according to the present invention.

Referring now to FIG. 1, a computer-to-plate or computer-to-press system 10 includes a scanner 11 or other digitizing apparatus for scanning an original 12 to develop digital data representing a characteristic (such as reflected light intensity) of each of a plurality of picture elements (or pixels). In the preferred embodiment, the original 12 comprises a color image and the scanner 11 develops data for each pixel for the red, green, or blue component of the image characteristic at such pixel. The scanner output data are provided to a computer 13 which converts the data into suitable data for operating one or more plate making devices to prepare plates for printing. Alternatively, the computer 13 may develop appropriate data for one or more electronic presses, if desired.

The computer 13 may further develop data for operating a display 14 for viewing the scanned image. If desired, the display 14 comprises a liquid crystal display (LCD) according to the present invention.

The scanned data from the scanner 11 is transformed into appropriate values to operate the display 14, as should be evident to one of ordinary skill in the art. The computer 13 may further provide such data to a different computer, for example, over a communications link, which in turn may operate a remote LCD display according to the present invention to allow soft proofing at such remote location.

Figure 2:
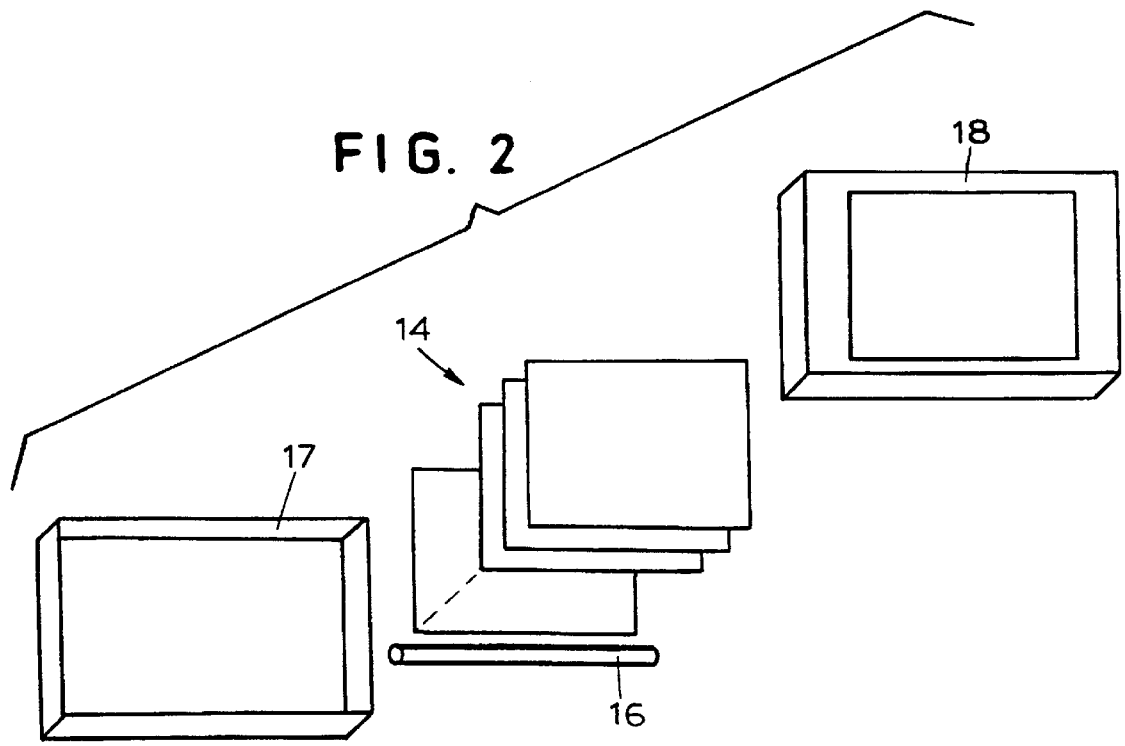
FIG. 2 comprises an exploded diagrammatic view of the display of FIG. 1.

FIG. 2 illustrates one example of the display 14 of FIG. 1 in greater detail. The display 14 includes a plurality of colored display elements or layers, together with an electronically controllable means 16 of illuminating the colored display elements, enclosed by an enclosure including a back cover 17 and a front cover 18.

Figure 3:
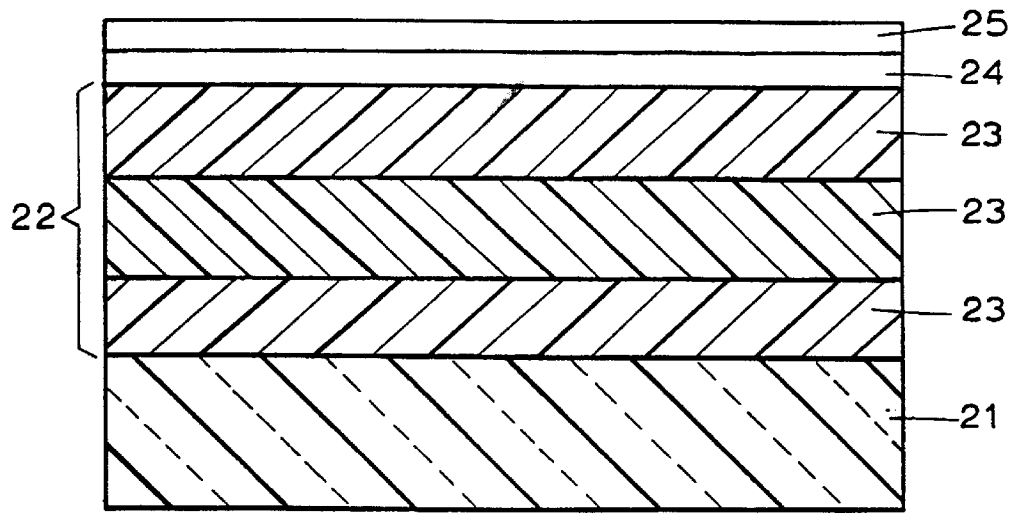
FIG. 3 comprises a cross-sectional view of an assembled filter used in the display of FIG. 2.

Referring now to FIG. 3, the display layers include a glass substrate 21 with a filter stack 22, consisting of a plurality of pigmented layers of material, each of which may comprise a pigmented acrylic, pigmented photoresist or other pigmented composite. A planarizing layer 24 is located on top of the stack and display addressing electrodes 25 are located on the planarizing layer 24. The filter stack, together with the planarizing layer and display electrodes may be manufactured in accordance with the teachings of the U.S. Pat. No. 5,463,484, the disclosure of which is hereby incorporated by reference herein.

In accordance with the present invention, the selection of the particular colors for the pigmented acrylic or pigmented photoresist layer 34 can be made keeping in mind the particular inks and paper to be used in the final printing process, as well as the type of printing process (e.g., gravure, offset, flexography, etc. . . ). Generally, if a set of selected printing inks or colors are to be used to reproduce an image, a plurality of display elements in the form of the pigmented layers 23 are selected each for displaying a color substantially spectrally matched to one of the set of printing colors. It is preferable that the spectral curve of each light source 16 be as flat as possible over the visible spectrum. In addition, the intensity or brightness of the illumination means 16 may be limited to limit the color gamut produced by the display, if desired Gamut flexibility may also be affected by the choice of the spectra of the pigmented layers 23 and the color temperature of the light source(s).

If desired, the pigmented layers 23 may have spectral characteristics matched to non-process colors, such as red, green, and blue, or any other color, such as a color used in a particular trademark or other image. If desired, one could select a filter with cyan, magenta and yellow pixel elements and produce a resultant secondary color.

Still further, a greater or lesser number of pigmented layers 23 may be used. For example, the process colors may be used in combination with one or more non-process colors, as desired.

Still another alternative is to select pigmented layers 23 and/or select the color temperature of the illumination source 16 and/or control the brightness thereof to permit reproduction of colors beyond the color gamut that can be reproduced using ink and paper.

By appropriate selection of the pigmented layers, a broad spectral curve can be obtained for each primary color of the display. Such curves more closely approximate the spectral characteristics of ink on paper than the phosphors of a CRT, which are relatively narrow-band and cannot produce the color fidelity necessary to match inks on paper.

The method of the present invention is not restricted to specific colors, and any combination and number of colors and layers can be utilized to generate color filters both of the additive color and subtractive color variety.

Figure 4:
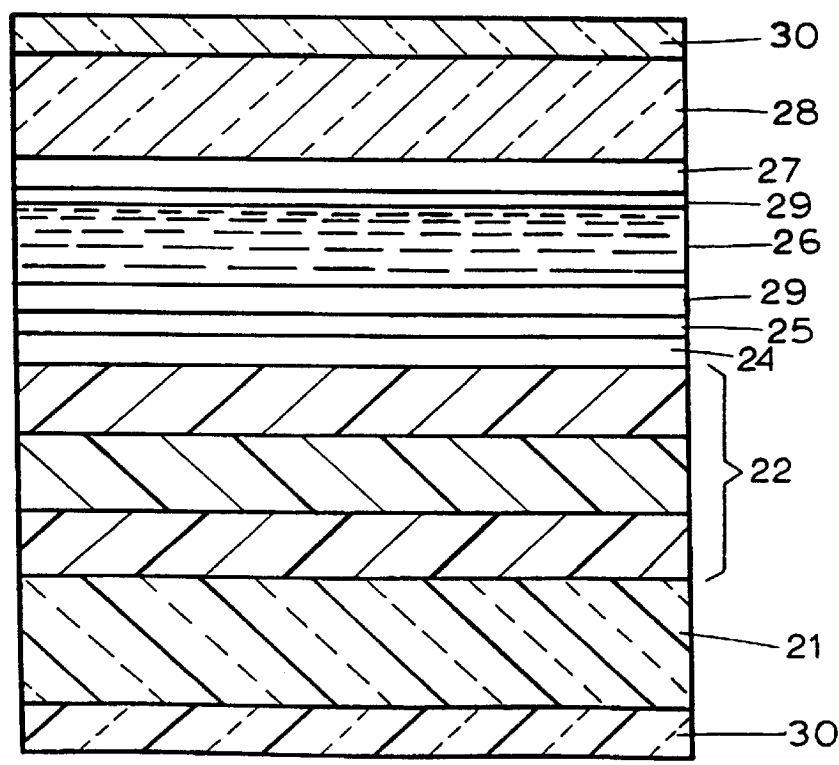
FIG. 4 illustrates an assembled display consisting of the color filter of FIG. 3, using the colorants of the present invention, shown by way of example with an electronically addressable white light modulating unit of the liquid crystal type.
Figure 4:

FIG. 4 shows a completed display including the color filter and a means for electronically modulating the brightness of an incident white light source, here chosen to be a nematic liquid crystal layer for purposes of illustration. Adhesive or other means is provided to hold the various layers together.

A nematic liquid crystal layer 26 is located between alignment layers 29 and addressing electrodes 25 and 27 on opposite sides. The color filter stack 22 and planarizing layer 24 are constructed in accordance with U.S. Pat. No. 5,463,484, wherein the colorants can be those described above in accordance with the present invention. Two glass panels 21 and 28 enclose the assembly described and linear polarizing filters 30, arranged in mutually perpendicular orientations are attached to the two outside faces of the assembly.

A planar white light source 31, which may comprise the illuminating means 16 and which uniformly illuminates the entire display area, completes the display system. It will be understood that FIG. 4 illustrates one possible passive or active matrix display assembly according to the present invention and that other means of illuminating the colored elements with electronically modulated white light are equally within the purview of the present invention. For example, a cathode ray tube (CRT), preferably of the black and white type, may be provided behind the color filter stack 22 and the brightness of various regions of the CRT may be controlled to reproduce the image. Alternatively, a particle layer or film layer may be suspended behind the color filter stack 22 and may be backlit. The particle or film layer may include regions of differing light transparency to reproduce the image. Any other means of producing white light intensities with a substantially flat spectral characteristic curve and having regions ranging from dark to bright in regions corresponding to and aligned with the colored display elements may alternatively be used. The intensity levels of the white light source may further be selected to limit the gamut of displayed colors.

Still further, other fabrication techniques and/or display structures could be used. For example, a glass substrate could be coated with a first layer of pigmented material, such as liquid photoresist in which pigments are dispersed or a pigmented acrylic photopolymer using a particular coating technique (such as a spin coating or spray coating process) and the layer could be exposed through a mask and developed. Two (or more) additional layers of pigmented material could be sequentially deposited over the first layer and similarly exposed and developed. The colors so deposited may be red, green and blue or cyan, magenta and yellow or any other colors. Provided that a reasonable spectral match to ink on paper (or ink or other colorant on another medium) could be obtained, whether by the combination of individual red, green and blue layers or by individual overlapped cyan, magenta and yellow layers, the resulting display panel may then be illuminated and used to perform color proofing. While current spin coating techniques may not be able to produce the required color consistency within the viewing area or to produce color uniformity from screen-to-screen in a mass production environment, the spin coating technique is sufficiently developed to permit manufacture of limited quantities of displays of acceptable quality. Further, the spin coating technique may be improved and/or another suitable technique may be developed and/or may currently be available to satisfy consistency and uniformity requirements.

It will be apparent to those of ordinary skill in the art that various modifications may be made to the present invention without departing from the spirit and scope thereof. The scope of the present invention is only intended to be limited by the appended claims.

What is claimed is:

1. A display for soft proofing an image to be reproduced using a set of selected colorants, comprising:

a plurality of display layers each comprising a coating of pigmented material which is exposed through a mask and developed; and means for illuminating the plurality of display layers wherein the display appearance is substantially spectrally matched to the set of colorants.

2. The display of claim 1, wherein each coating of pigmented material is deposited on a glass substrate by a coating process.

3. The display of claim 2, wherein the pigmented material comprises a photoresist in which a pigment is dispersed.

4. The display of claim 2, wherein the pigmented material comprises a pigmented acrylic photopolymer.

5. The display of claim 2, wherein the coating process comprises a spin coating process.

6. The display of claim 2, wherein the coating process comprises a spray coating process.

7. The display of claim 1, wherein the display layers comprise red, green and blue display layers.

8. A method of forming a display panel for soft proofing an image to be reproduced using a set of selected printing colorants, the method comprising the steps of:

providing a substrate;

forming a first display layer on the substrate;

forming a second display layer on the first display layer; and forming a third display layer on the second display layer, wherein each of the forming steps comprises the steps of depositing a layer of light-sensitive liquid pigmented material, exposing the layer of pigmented material through a mask and developing the exposed layer of pigmented material and wherein the display appearance is substantially spectrally matched to the set of selected printing colorants.

9. The method of claim 8, wherein the step of depositing in each of the forming steps comprises the step of spin coating the layer of liquid pigmented material.

10. The method of claim 8, wherein the step of depositing in each of the forming steps comprises the step of spray coating the layer of liquid pigmented material.

11. The method of claim 8, wherein the pigmented material comprises a photoresist in which a pigment is dispersed.

12. The method of claim 8, wherein the pigmented material comprises a pigmented acrylic photopolymer.

13. The method of claim 8, wherein the display layers comprise red, green and blue display layers.

\* \* \* \* \*